United States Patent [19]

Takigami

[11] Patent Number: 5,353,234
[45] Date of Patent: Oct. 4, 1994

[54] COMPUTER AIDED DESIGNING SYSTEM FOR DESIGNING A PATTERN FOR A PRINTED CIRCUIT BOARD

[75] Inventor: Koutaro Takigami, Tokyo, Japan

[73] Assignee: Fuji Photo Film Co., Ltd., Tokyo, Japan

[21] Appl. No.: 77,494

[22] Filed: Jun. 17, 1993

Related U.S. Application Data

[63] Continuation of Ser. No. 654,891, Feb. 13, 1991, abandoned.

[30] Foreign Application Priority Data

Feb. 15, 1990 [JP] Japan .................... 2-32513

[51] Int. Cl.$^5$ ............................. G06F 15/60
[52] U.S. Cl. ...................... 364/489; 364/488
[58] Field of Search ............ 364/488, 489, 490, 491

[56] References Cited

U.S. PATENT DOCUMENTS

| | | | |
|---|---|---|---|
| 4,580,228 | 4/1986 | Noto | 364/491 |
| 4,777,606 | 10/1988 | Fournier | 364/491 |
| 5,032,991 | 7/1991 | Davidson et al. | 364/490 |
| 5,038,294 | 8/1991 | Arakawa et al. | 364/491 |
| 5,097,406 | 3/1992 | Narasimhan et al. | 364/491 |

OTHER PUBLICATIONS

"Automatic Wiring Procedure in Interactive Type Printed Substrate Design System" by Togashi et al., 30th National Conf. (First Half of 1985) of the Information Processing Society of Japan, pp. 1903-1904.

*Primary Examiner*—Vincent N. Trans

[57] ABSTRACT

A computer aided designing (CAD) system has an inputting section for inputting data including connection information and part information associated with circuit elements which belong to a plurality of circuit blocks which in combination constitute a single circuit, and a net list for combining a plurality of designed circuit diagrams each being representative of a respective one of the circuit blocks into a single circuit diagram. The data entered on the inputting section is stored in a storage. A data processing section reads the connection information and part information out of the storage to generate patterns of virtual printed circuit boards each being associated with a respective one of the circuit blocks, and reads the net list out of the storage to combine the patterns into a single pattern to be provided on a single printed circuit board.

12 Claims, 5 Drawing Sheets

COMPUTER AIDED DESIGNING SYSTEM FOR DESIGNING A PATTERN FOR A PRINTED CIRCUIT BOARD

This application is a continuation of application Ser. No. 07/654,891 filed on Feb. 13, 1991, now abandoned.

BACKGROUND OF THE INVENTION

1. Field of the Invention

The present invention relates to a computer aided designing (CAD) system and, more particularly, to a CAD system for designing a pattern to be provided on a printed circuit board, and also to a method thereof.

2. Description of the Related Art

Today, CAD systems are extensively used in the electronic circuit designing art. Generally, the number of parts to be mounted on a printed circuit board and the number of connection information (nets) essential in wiring the individual parts increase as the circuit integration on the printed circuit board is promoted. Then, for a printed circuit board having a given area, the amount of data which should be entered on a CAD system greatly increases. A conventional CAD system, therefore, needs much time and labor for designing a pattern of a printed circuit board.

Moreover, in a CAD system, a plurality of circuit blocks to be mounted on a single printed circuit board are designed independently of each other by different persons. Another problem with a conventional CAD system is, therefore, that a person in charge of the design of a pattern of a printed circuit board is often unable to pattern circuits which the person does not know on a printed circuit board. This coupled with the increase in circuit scale as stated above, further slows down the pattern designing procedure which uses a CAD system.

SUMMARY OF THE INVENTION

It is therefore an object of the present invention to provide CAD system having an editing function which enhances efficient operations for designing a pattern of a printed circuit board.

A CAD system of the present invention has an inputting section for inputting data including connection information and part information associated with circuit elements belonging to a plurality of circuit blocks which in combination constitute a single circuit and a net list for combining a plurality of designed circuit diagrams each being representative of a respective one of the circuit blocks into a single circuit diagram. The data entered on the inputting section is stored in a storage. A data processing section reads the connection information and part information out of the storage to generate patterns of virtual printed circuit boards each being associated with respective one of the circuit blocks, and reads the net list out of the storage to combine the patterns into a single pattern to be provided on a single printed circuit board.

Also according to the present invention, a method is provided for designing a pattern on a printed circuit board by use of a data processor system, comprising the steps of: preparing a data processor system including a storage: providing the data processor system with data including connection information and part information associated with circuit elements belonging to a plurality of circuit blocks which in combination constitute a-single circuit, and a net list defining a combination of a plurality of designed circuit diagrams each being representative of a respective one of said plurality of circuit blocks into a single circuit diagram: storing the data entered in the storage of the data processor system: reading the connection information and the part information out of the storage, and generating patterns of virtual printed circuit boards each being associated with a respective one of said plurality of circuit blocks: reading the net list out of the storage, and combining the patterns into a single pattern to be provided on a single printed circuit board.

BRIEF DESCRIPTION OF THE DRAWINGS

The objects and features of the present invention will become more apparent from the consideration of the following detailed description taken in conjunction with the accompanying drawings in which.

Figure 2:
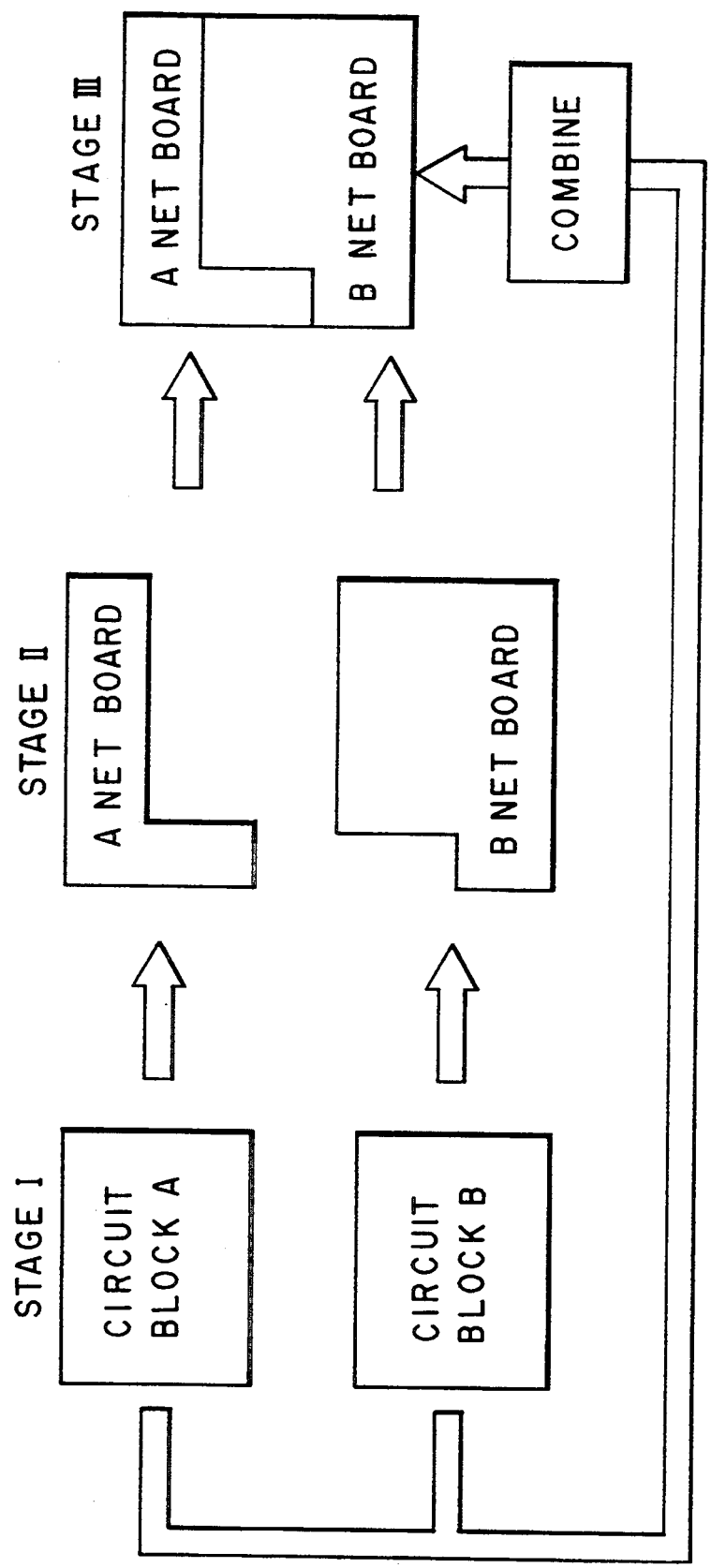
FIG. 2 is a chart representative of consecutive stages for combining a plurality of fractioned and independently designed circuit blocks into a single pattern to be provided on a printed circuit board.
Figure 4:
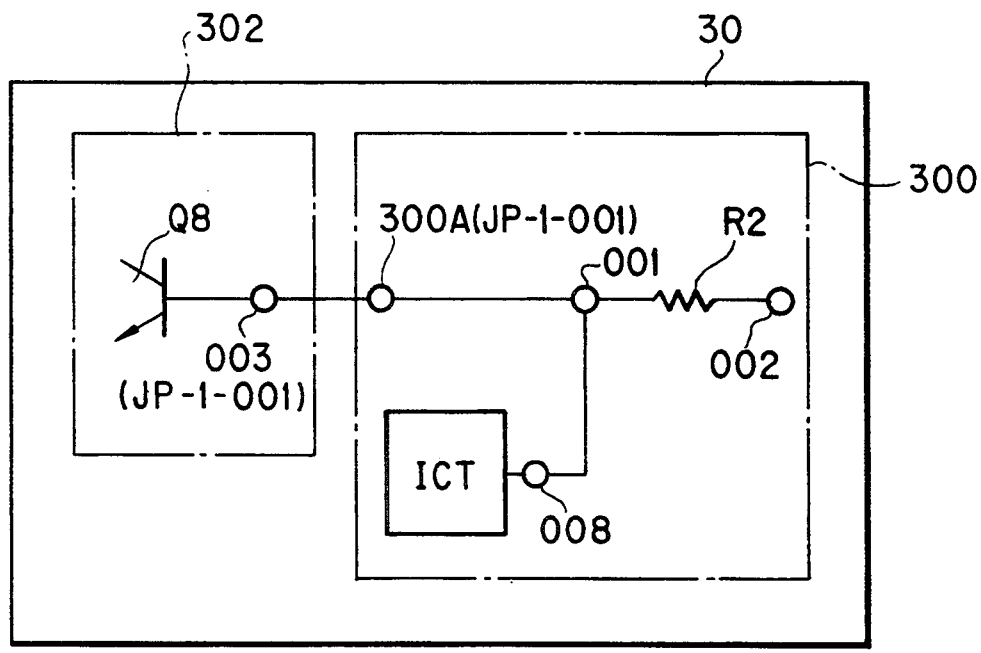
Figure 6:
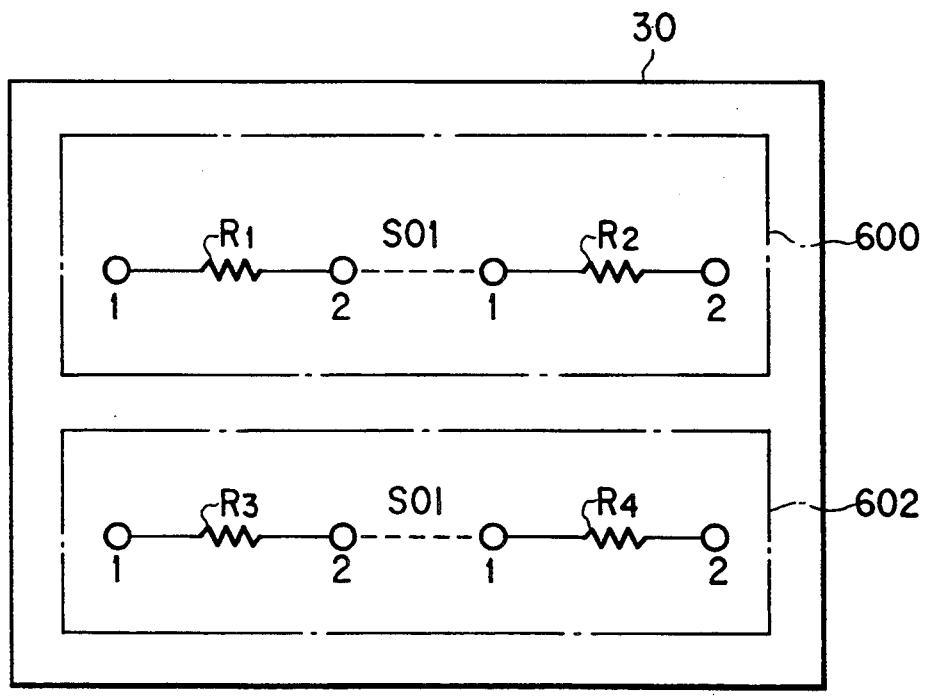
Figure 5A:
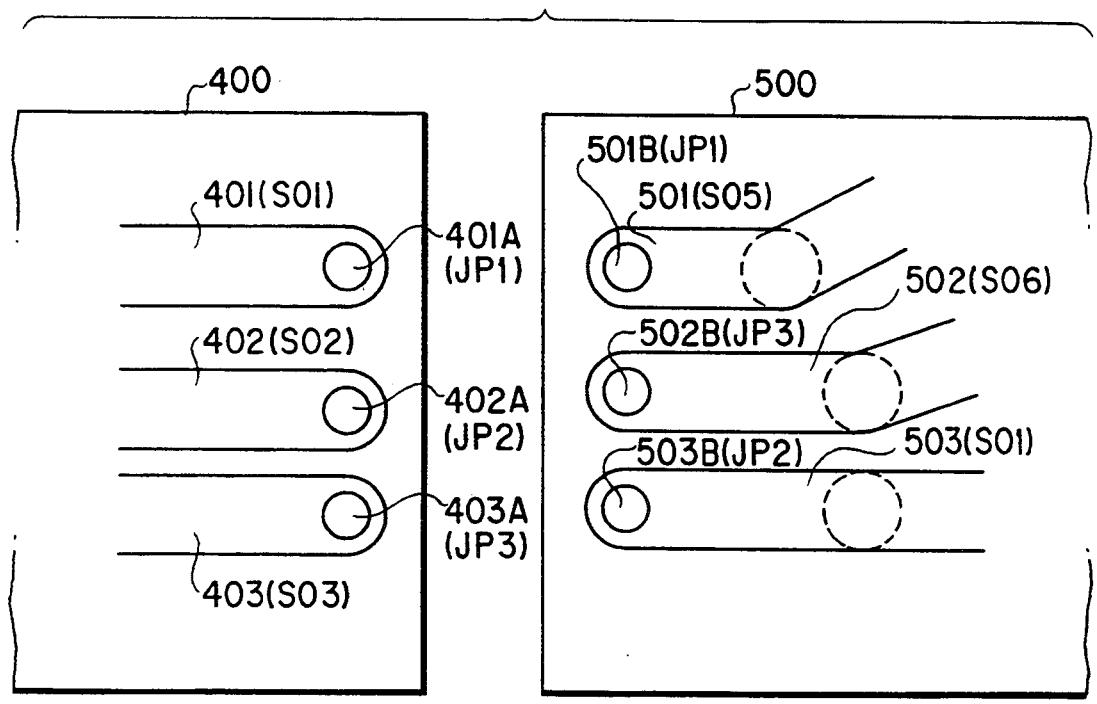
Figure 5B:
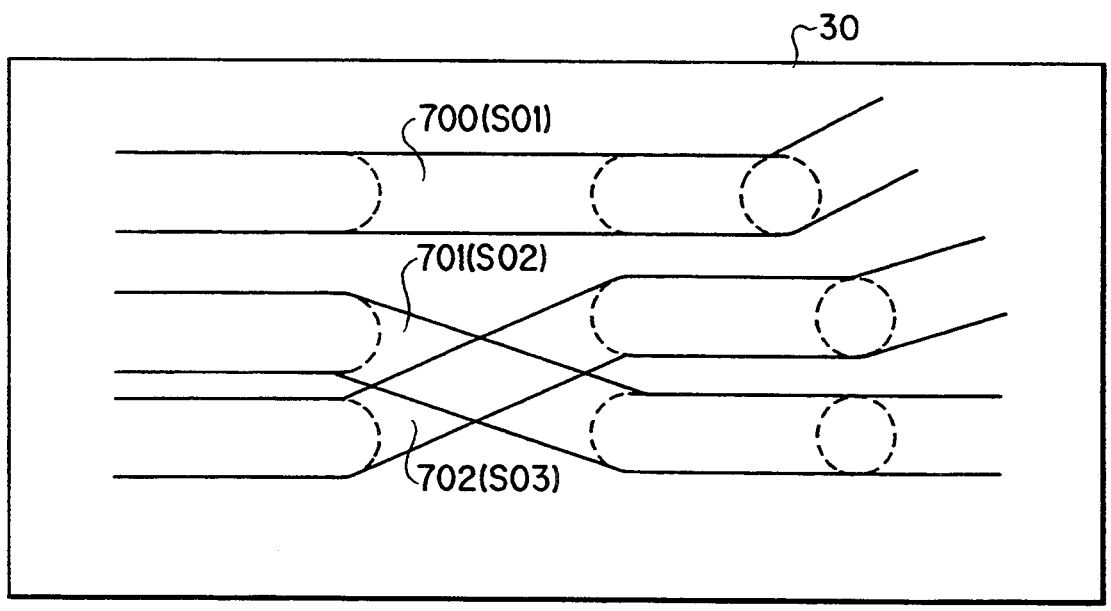

FIG. Z is a flowchart demonstrating the consecutive stages of FIG. 2 more specifically;

FIG. 4 is a schematic diagram showing specific connection information used to combine printed circuit patterns each being associated with a respective one of a plurality of circuit blocks;

FIG. 5A schematically shows a relation between connection information and virtual terminals of a plurality of independent printed circuit boards;

FIG. 5B is a view similar to FIG. 5A, showing a relation which is set up between the connection information and the virtual terminals after the printed circuit boards have been combined; and FIG. 6 is a schematic diagram showing the fact that identical connection information appears on different printed circuit boards each being associated with a respective one of a plurality of circuit blocks.

DESCRIPTION OF THE PREFERRED EMBODIMENT

Figure 1:
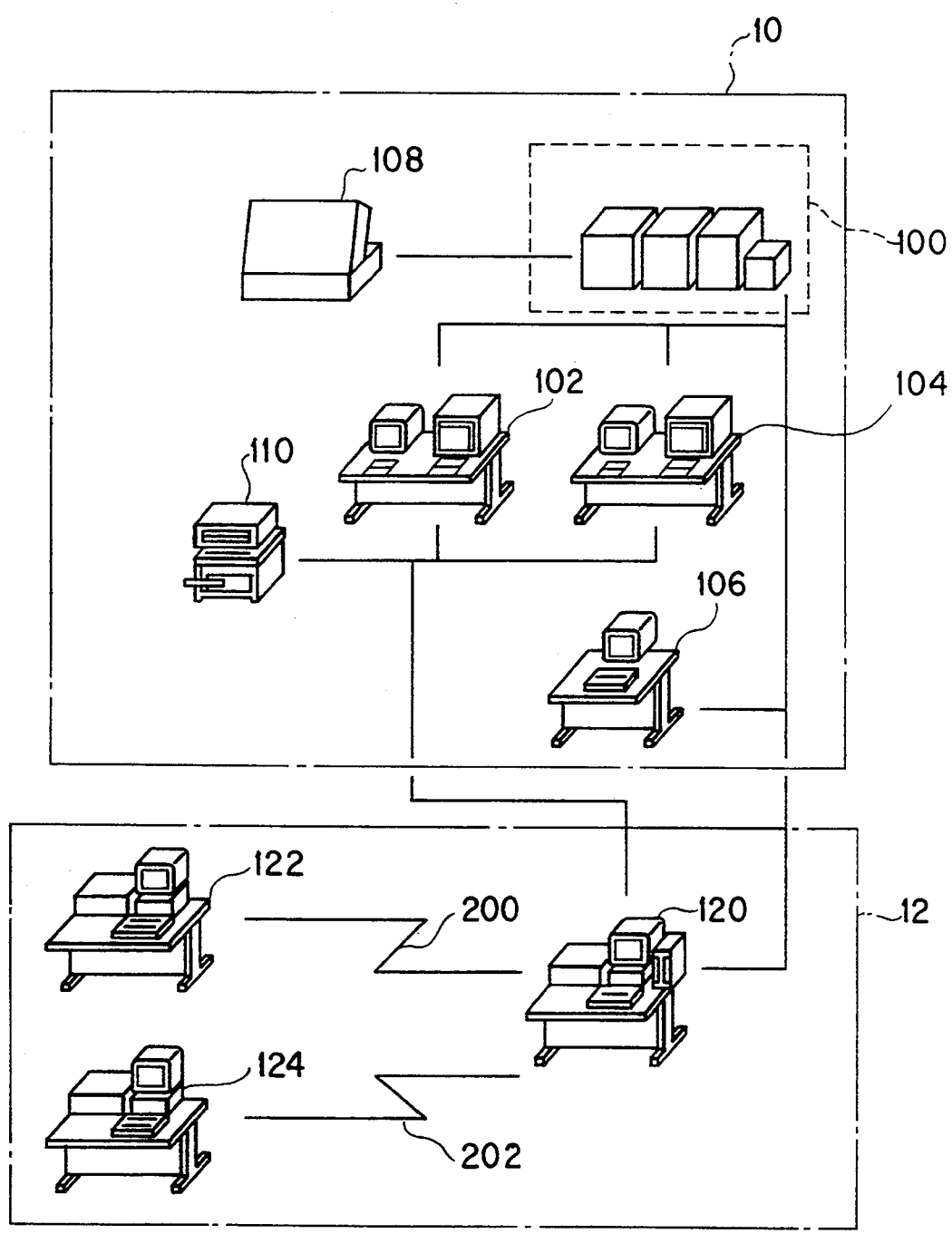
FIG. 1 is a schematic view showing the general architecture of a CAD system embodying the present invention.

Referring to FIG. 1 of the drawings, a CAD system embodying the present invention is shown which is generally made up of a central section 10 and a peripheral section 12. The central section 10 has implementations accessible for designing circuits and designing patterns to be provided on printed circuit boards. The peripheral section 12 is used to perform preliminary circuit designing, and to search for technical data, data control, and other various kinds of operations for backing up the central section 10. The central section 10 has interactive functions and automatic generating functions for implementing a variety of design items.

Specifically, the central section 10 has a main computer 100 having a storage built therein, graphic input terminals 102 and 104, a program input terminal 106, an electrostatic plotter 108, and a printer 110. It is to be noted that the two graphic input terminals 102 and 104 are merely representative of a plurality of graphic terminals, and that the electrostatic plotter 108 and printer 110 are specific forms of graphic output terminals. The major functions assigned to the central section 10 are to design circuits and to design patterns to be provided on printed circuit boards.

The main computer 100 has a CPU, a storage of the kind using a magnetic tape, a magnetic disk or a similar recording medium, an interface, and a modulator/demodulator, etc., although not shown in the figure. The graphic input terminals 102 and 104 each is accessible for entering various kinds of necessary data in the event of circuit designing or pattern designing. The program input terminal 105 is operated to enter and transfer various programs in the storage built in the main computer 100 or a storage built in a personal computer 120 which plays the role of a data totalizing station. The programs include a net list generating program, part arranging and wiring program, design rule checking program, output line program, and a part searching program. The electrostatic plotter 108 draws a circuit diagram, print pattern or similar graphic image designed in the main section 10. The printer 110 prints out net lists, part lists and other data on a medium to produce a hard copy.

The peripheral section 12 has circuit diagram input terminals 122 and 124 in addition to the personal computer or data totalizing terminal 120. These input terminals 122 and 124 are also simply representative of a plurality of input terminals. The circuit diagram input terminals 122 and 124 are connected to the personal computer 120 by telephone lines 200 and 202, respectively, and each is located at a particular designing spot. It should be noted that the telephone lines 200 and 202 are only illustrative means for connecting the circuit diagram input terminals 122 and 124 to the personal computer 120 and may be replaced with LAN (Local Area Network) for example, if desired.

Figure 3:
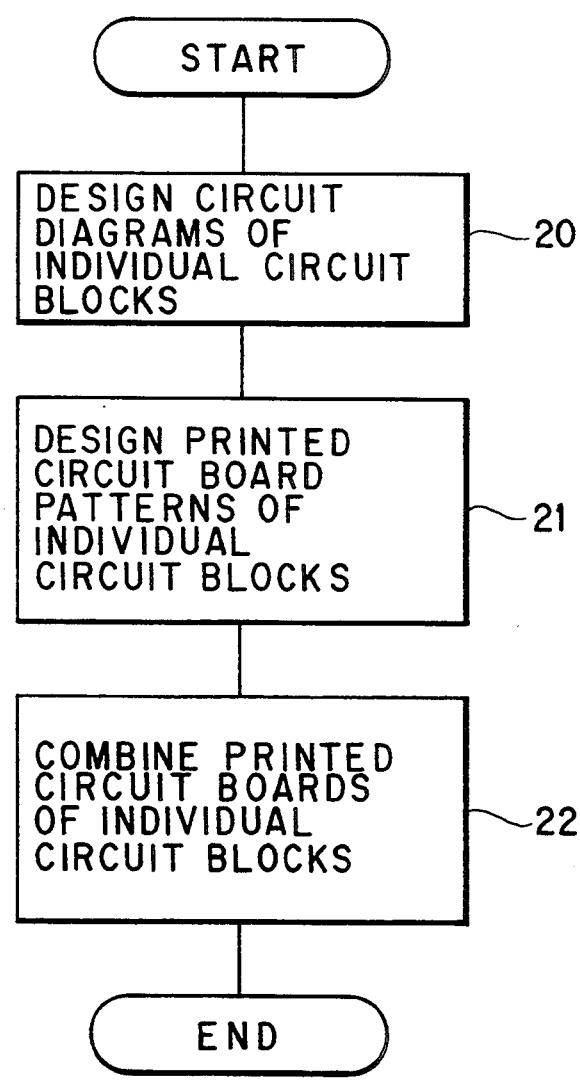

A specific operation of the CAD system having the above construction will be described with reference to FIGS. 2 and 3. In FIG. 2, there are shown consecutive stages I, II and III for combining a plurality of fractioned and independently designed circuit blocks into a single circuit pattern to be provided on a printed circuit board. FIG. 3 is a flowchart representative of a sequence of steps 20 to 22 which describe the stages I, II and III more specifically. The procedure begins with the stage I or step 20 for designing a plurality of fractioned circuit blocks (circuit blocks A and B in the illustrative embodiment) each forming a part of a single circuit to be designed. Specifically, persons intending to design the circuit blocks A and B, respectively, each enter part information and connection information relating to the circuit block of interest, i.e., a net list on one of the circuit diagram input terminals 122 or 124 of the peripheral section 12 while watching a display. The net lists entered on the individual input terminals 122 and 124 are sent to the storage built in the main computer 100 of the central section 10 over the telephone lines 200 and 202, respectively, and via the data totalizing terminal 120.

The connection information mentioned above includes the names given to the groups or assemblies of circuit elements which should be connected to each other, and the names given to pins to be connected. The part information includes numbers assigned to individual parts according to the order of generation, the positions and orientations of parts on a circuit diagram, the names of parts registered, the reference numbers, and the names of parts which will be used when they are developed on a substrate. The numbers representative of the order of part generation as mentioned above each is assigned to particular part data which has just been fetched from a part file and has not been provided with a reference number, thereby implementing the identification of individual parts. Regarding the reference numbers also mentioned above, circuit elements are grouped on a kind basis (e.g. ICs, transistors, resistors and so on), and each is numbered within the group to which it belongs (e.g. R1, Q1, IC1 and so on).

In the stage II or step 21, persons stationed at the graphic input terminals 102 and 104, respectively, fetch the data representative of the individual circuit blocks having been sent to the storage of the main computer 100 from the circuit block input terminals 122 and 124. While watching the displays of the input terminals 102 and 104, the operators design respectively print patterns of virtual printed circuit boards each being associated with one of the circuit blocks A and B, i.e. A net board and B net board as shown in FIG. 2. Such an operation is implemented by the interactive functions and automatic generating functions of the central section 10. As shown in FIG. 6, assume that a series connection of resistors R1 and R2 and a series connection of resistors R3 and R4 should be respectively formed on virtual printed circuit boards A 600 and B 602 which will be combined into a single printed circuit board 30. In this instance, a program stored in the storage of the main computer 100 gives a different reference number to each of the resistors R1 to R4 to prevent them from being mixed up on the virtual printed circuit boards A 600 and B 602.

On the other hand, regarding the connection information meant for circuit elements, identical information appears on both of the printed circuit boards A and B each being associated with a respective one of the independent circuit blocks. This is because the central section 10 gives connection information sequentially to each virtual printed circuit board due to the inherent software thereof. For example, in FIG. 6, while connection information S01 is assigned to the printed circuit board A 600 to show that the resistors R1 and R2 should be connected to each other at their terminals 2 and 1, respectively, it is also assigned to the printed circuit board B 602 to show that the resistors R3 and R4 should be connected at their terminals 2 and 1.

In the illustrative embodiment, the system gives a particular reference number to each part to be mounted on a virtual printed circuit board, so that independent virtual printed circuit boards may not share identical reference numbers. Alternatively, the system may be so modified as to give common reference numbers to independent virtual printed circuit boards and, when such printed circuit boards are to be combined, validate the reference numbers of particular parts while replacing the reference numbers of the other parts with new reference numbers.

Finally, in the stage III or step 22, the patterns designed on the virtual printed circuit boards A and B are combined into a single printed circuit board. FIG. 4 shows how specific patterns provided on printed circuit boards A 300 and B 302 are combined. Let the virtual terminals of the printed circuit boards A 300 and B 302 be named JP-1-001. A net list, or connection information, is generated beforehand to show that the groups having an identical virtual terminal name should be connected to a single point in the event of combining independent printed circuit boards into a single printed circuit board. Such a net list is stored in the storage of the main computer 100 installed in the central section 10. Each of the virtual terminals each is set as a wiring target of the associated circuit block.

In the stage III, a person stationed at either one of the graphic input terminals 102 and 104 (assume terminal 102 by way of example) operates it to fetch the net list from the storage of the main computer 100. Then, the operator searches for data (connection information) indicative of the groups of circuit elements which have an identical virtual terminal name on the two independent printed circuit boards A and B. By referencing the net list, the operator manipulates the screen of the graphic input terminal 102 to connect such groups of circuit elements having the same terminal name. As shown in FIG. 4, assume that the printed circuit boards A 300 and B 302 have an identical virtual terminal name JP-1-001 by way of example. Then, when the graphic input terminal 102 is operated, the names of parts connected to the virtual terminals JP-1-001, the names of terminals of such parts, and data specifying connection information associated with the circuit elements are displayed on the graphic input terminal 102. Namely, data SO 01 (JP-1-001, R2-001, IC-008) and data S008 (JP-1-001, Q8-003) appear on the screen of the input terminal 102 as connection information belonging to the printed circuit boards A 300 and B 302, respectively. At the same time, the print pattern shown in FIG. 4 appears on the screen of the input terminal 102. It is to be noted that the print pattern of FIG. 4 is represented only by symbols of circuit elements for the sake of illustration. The data SO 01 (JP-1-001, R2-001, IC-008) indicates that a terminal 001 of a resistor R2 and a terminal 008 of an integrated circuit IC3 are connected to a virtual terminal 300A(JP-1-001) inside of the printed circuit board A 300, and that a name S001 is given to connection information representative of such connections. Likewise, the data S008 (JP-1-001, Q8-003) indicates that a transistor Q8 is connected to a virtual terminal 003 (JP-1-001) provided in the printed circuit board B 302.

When the print patterns of the printed circuit boards A300 and B302 stated above specifically are combined, data are changed such that the virtual terminals 300A (JP-1-001) and 003 (JP-1-001) are connected to each other, i.e., the virtual terminals JP-1-001 disappear. At this time, the connection information of the combined circuit blocks are updated and replaced with new information such as data S004 (R2-001, IC3-008, Q8-003). This data S004 appears on the composite printed circuit board 30 only once.

In FIG. 4, the printed circuit boards A 300 and B 302 each is shown as having a single group of circuit elements for illustration. In practice, a plurality of groups of circuit elements whose terminals are given identical names are combined individually by the same procedure. Specifically, as shown in FIG. 5A, assume that print patterns of printed circuit boards A 400 and B 500 each has been produced in association with a particular circuit block. In the printed circuit board A400, wirings 401, 402 and 403 are provided with virtual terminals JP1, JP2 and JP3, respectively. Connection information S01, S02 and S03 are associated with the virtual terminals JP1, JP2 and JP3, respectively. In the other printed circuit board B 500, wirings 501, 502 and 503 are provided with virtual terminals JP1, JP2 and JP3, respectively, and their connection information are SO 5, SO 6 and SO 1.

The printed circuit boards A 400 and B 500 having the above print patterns are combined by the following procedure. As shown in FIG. 5B, the virtual terminals having an identical virtual terminal name are connected to each other, and then the names of resulted connection information are sequentially changed according to the order of connection. Specifically, as the virtual terminals JP1, the virtual terminals JP2 and the virtual terminals JP3 are connected by wirings 700, 701 and 702, respectively, the virtual terminals of the individual printed circuit boards A 400 and B 500 disappear on the composite circuit board 30 while new connection information A01, S02 and S03 are assigned to the resulted connections.

In summary, it will be seen that the present invention provides a CAD system which enhances efficient designing of patterns to be provided on printed circuit boards. This advantage is derived from a unique procedure wherein fractioned circuit blocks are designed in parallel independently of each other, patterns of printed circuit boards each corresponding to a respective one of the circuit blocks are designed, and then the patterns are combined on the basis of a net list or connection information.

While the present invention has been described with reference to the particular illustrative embodiment. It is not to be restricted by the embodiment but only by the appended claims. It is to be appreciated that those skilled in the art can change or modify the embodiment without departing from the scope and spirit of the present invention.

What is claimed is:

1. A computer aided designing (CAD) system for designing a circuit pattern for a single printed circuit board, comprising:
  inputting means for inputting circuit data for the single printed circuit board virtually fractioned into a plurality of fractioned circuit blocks each provided with connection information and designing data of circuit components into a storage area;
  data processing means for designing in parallel a plurality of virtual printed circuit boards respectively on the basis of the plurality of fractioned circuit blocks, the virtual connection information and the designing data of circuit components being read out of said storage area;
  combining means for combining the plurality of virtual printed circuit boards designed into the circuit pattern to be printed as the single printed circuit board in accordance with the virtual connection information read out of said storage area; and
  deleting means for deleting the virtual connection information upon completing the combination of the plurality of virtual printed circuit boards.

2. A CAD system in accordance with claim 1, wherein said inputting means comprises a plurality of circuit diagram input terminals each being assigned to a respective one of said plurality of fractioned circuit blocks.

3. A CAD system in accordance with claim 2, further comprising data totalizing means for totalizing data entered on said plurality of circuit diagram input terminals.

4. A CAD system in accordance with claim 3, wherein said plurality of circuit diagram input terminals each is connected to said data totalizing means by a telephone line.

5. A CAD system in accordance with claim 3, wherein said plurality of circuit diagram input terminals are connected to said data totalizing means by a LAN (Local Area Network).

6. A CAD system in accordance with claim 3, wherein said data totalizing means comprises a personal computer.

7. A CAD system in accordance with claim 3, further comprising program inputting means for inputting programs and selectively transferring said programs to said storage area and said data totalizing means.

8. A CAD system in accordance with claim 7, wherein said data totalizing means comprises a personal computer.

9. A CAD system in accordance with claim 1, wherein said storage area comprises a storage built in a main computer.

10. A CAD system in accordance with claim 1, wherein said data processing means comprises a plurality of graphic input terminals.

11. A method of designing a circuit pattern to be provided on a single printed circuit board by the use of a data processor system, comprising the steps of:

inputting into the data processor system circuit data for the circuit fractioned into a plurality of fractioned circuit blocks each provided with connection information and designing data of circuit components;

designing a plurality of virtual fractioned printed circuit boards on the basis of the plurality of fractioned circuit blocks by reading the circuit data and the designing data of circuit components out of the data processor system;

combining the plurality of virtual printed circuit boards into a printed circuit board in accordance with the connection information read out of the data processor system; and deleting the connection information upon completing the combination of the plurality of virtual fractioned printed circuit boards.

12. A method in accordance with claim 11, further comprising the steps of:

assigning a plurality of circuit diagram input terminals to a respective one of the plurality of fractioned circuit blocks to enter the data in the plurality of circuit diagram input terminals; and totalizing the data entered on said plurality of circuit diagram input terminals.

* * * * *